US008426744B2

(12) United States Patent
Hayashi

(10) Patent No.: US 8,426,744 B2
(45) Date of Patent: Apr. 23, 2013

(54) HOLDING MEMBER, MOUNTING STRUCTURE HAVING THE HOLDING MEMBER MOUNTED IN ELECTRIC CIRCUIT BOARD, AND ELECTRONIC PART HAVING THE HOLDING MEMBER

(75) Inventor: Toshiaki Hayashi, Aichi (JP)

(73) Assignee: Tyco Electronics Japan G.K., Kanagawa-Ken (JP)

( * ) Notice: Subject to any disclaimer, the term of this patent is extended or adjusted under 35 U.S.C. 154(b) by 133 days.

(21) Appl. No.: 12/845,396

(22) Filed: Jul. 28, 2010

(65) Prior Publication Data

US 2010/0288547 A1 Nov. 18, 2010

Related U.S. Application Data

(63) Continuation of application No. PCT/JP2009/050842, filed on Jan. 21, 2009.

(30) Foreign Application Priority Data

Jan. 30, 2008 (JP) ................................ 2008-019276

(51) Int. Cl.

*H05K 1/16* (2006.01)
*H05K 1/11* (2006.01)
*H01R 12/04* (2006.01)
*H01R 12/16* (2006.01)
*H01R 13/66* (2006.01)

(52) U.S. Cl.

USPC ........... 174/260; 174/262; 361/740; 361/747; 361/785; 439/569; 439/571; 439/574; 439/576

(58) Field of Classification Search .................. 439/567, 439/569–576

See application file for complete search history.

(56) References Cited

U.S. PATENT DOCUMENTS

| | | | | |
|---|---|---|---|---|
| 5,085,589 | A * | 2/1992 | Kan | 439/92 |
| 5,316,500 | A * | 5/1994 | Vanaleck et al. | 439/567 |
| 5,529,514 | A | 6/1996 | Gargiulo | |
| 7,172,457 | B1 | 2/2007 | Lin | |
| 2009/0305556 | A1 | 12/2009 | Kawahara et al. | |

FOREIGN PATENT DOCUMENTS

| | | |
|---|---|---|
| JP | 6-62486 | 9/1994 |
| JP | 08-064276 | 3/1996 |
| JP | 2007-128772 | 5/2007 |

OTHER PUBLICATIONS

European Search Report, Reference No. EAV548EPDJ44936, Application No. 09705774.9-1231, Patent No. 2259381, PCT/JP2009050842, dated Apr. 26, 2011, 9 pages.

PCT International Preliminary Report on Patentability and Written Opinion for co-pending International Application PCT/JP2009/050842 dated Aug. 31, 2010; 7 pages.

International Search Report for copending International Application No. PCT/JP2009/050842, 1 page date of completion Feb. 5, 2009.

* cited by examiner

*Primary Examiner* — Ishwarbhai B Patel
*Assistant Examiner* — Dion Ferguson
(74) *Attorney, Agent, or Firm* — Barley Snyder

(57) ABSTRACT

A holding member for connecting an electric part to an electric circuit board. The holding member has a base section, a pair of first leg sections, and a second leg section. The base section has a plate-like shape. The pair of first leg sections includes respective spring sections and hook sections. The second leg section includes a control section. The pair of first leg sections configured to be inserted into a through hole in the electric circuit board.

39 Claims, 11 Drawing Sheets

HOLDING MEMBER, MOUNTING STRUCTURE HAVING THE HOLDING MEMBER MOUNTED IN ELECTRIC CIRCUIT BOARD, AND ELECTRONIC PART HAVING THE HOLDING MEMBER

CROSS-REFERENCE TO RELATED APPLICATIONS

This application is a continuation of PCT International Application No. PCT/JP2009/050842, filed Jan. 21, 2009, which claims priority under 35 U.S.C. §119 to Japanese Patent Application No. 2008-019276, filed Jan. 30, 2008.

FIELD OF THE INVENTION

The invention relates to a holding member, and in particular, to a holding member for holding an electronic part on an electric circuit board, a mounting structure having such a holding member, and an electronic part having such a holding member.

BACKGROUND

Conventionally, it is known to mount an electronic part such as a connector on an electric circuit board, by pushing a holding member attached to the electronic part into a through hole formed in the electric circuit board. Further, there is a case in which the holding member is soldered to the electric circuit board in order to firmly fix the electronic part to the electric circuit board.

As such a holding member, there is proposed, for example, a technique for pushing a flat holding member, which is formed by stamping a metal plate, into a through hole of an electric circuit board, by elastically deforming the holding member in an in-plane direction (see, for example, Japanese Utility Model Laid-Open No. H6-62486 and U.S. Pat. No. 5,529,514). This holding member has such a shape that hook sections are positioned at both external sides of a pair of leg sections, which extend like a fork from a head section. The head section is fixed to a connector.

When the leg sections of the holding member are pushed into a through hole of an electric circuit board, the hook sections are caught on the electric circuit board after passing through the through hole of the electric circuit board. Therefore, even when the holding member fixed to the connector is in a state of being merely pushed into the through hole and yet to be soldered, the connector is retained not to fall off the electric circuit board by the holding member. However, since this holding member is flat and the pair of leg sections are made to elastically deform only in the in-plane direction, a large force is required to cause elastic deformation. Furthermore, the spring constant is difficult to reduce as compared to a spring capable of being elastically displaced in a board thickness direction. In addition, the amount of elastic deformation is small and a range in which plastic deformation is not achieved yet is limited. For this reason, there is a possibility that a notch in the surface of each of the pair of leg sections, which are formed by subjecting a metal plate to stamping, may make strong contact with an inner surface of the through hole when being pushed in, thereby damaging the inner surface of the through hole.

As a result, a known holding member addresses such a problem. For example, this holding member includes a pair of leg sections that extend in the approximately same direction from a tabular base section fixed to a connector, have respective wide-width spring pieces capable of being elastically displaced in a board thickness direction, and face each other (see, for example, Japanese Patent Laid-Open No. 2007-128772). The pair of leg sections of this holding member elastically deform in the board thickness direction, when this holding member is pushed into the through hole. Furthermore, when the holding member is merely pushed into the through hole and yet to be soldered, the holding member is held without falling off the electric circuit board since outer surfaces of the pair of leg sections are contact with an inner surface of the through hole. According to this design, when the holding member is pushed into the through hole, the outer surfaces of the pair of leg sections make soft contact with the inner surface of the through hole, which prevents the inner surface of the through hole from being damaged. However, this holding member has a disadvantage in that it is difficult to increase the elasticity of the leg sections. Therefore, such a holding member has a low holding strength in the state in which the holding member is merely pushed into the through hole and yet to be soldered. For this reason, for example, when the connector is grasped and handled by a robot while the holding member is in such a state, or when the holding member in such a state is pulled hard, the leg sections of the holding member may come out of the through hole.

SUMMARY

In view of the foregoing circumstances, it is an object of the present invention to provide a holding member that prevents a leg section from coming out of a through hole in a state of being merely inserted into a through hole and yet to be soldered, without damaging an inner surface of the through hole.

The holding member for connecting an electric part to an electric circuit board, includes a base section, a pair of first leg sections, and a second leg section. The base section has a plate-like shape. The pair of first leg sections includes respective spring sections and hook sections. The second leg section includes a control section. The pair of first leg sections configured to be inserted into a through hole in the electric circuit board.

BRIEF DESCRIPTION OF THE DRAWINGS

The invention is described in more detail in the following with reference to the embodiments shown in the drawings. Similar or corresponding details in the Figures are provided with the same reference numerals. The invention will be described in detail with reference to the following figures of which.

DETAILED DESCRIPTION OF THE EMBODIMENT(S)

Embodiments of the present invention will be described below with reference to the drawings.

Figure 1:
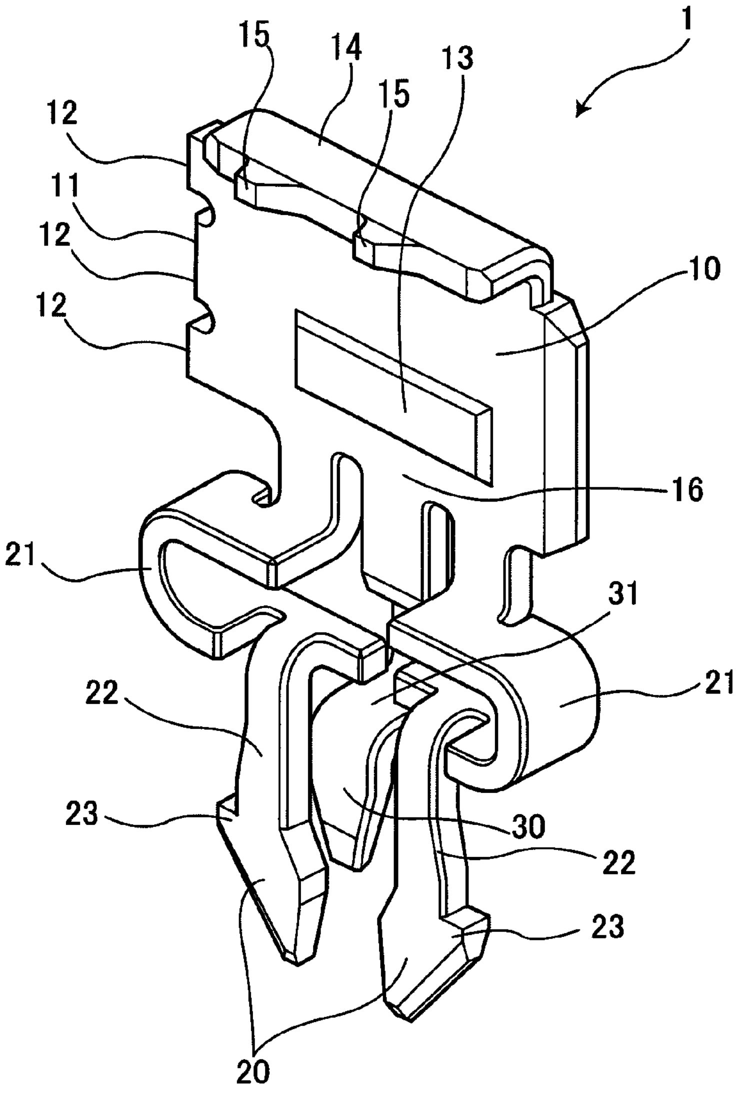
FIG. 1 is a front perspective view of a holding member according to the invention.
Figure 2:
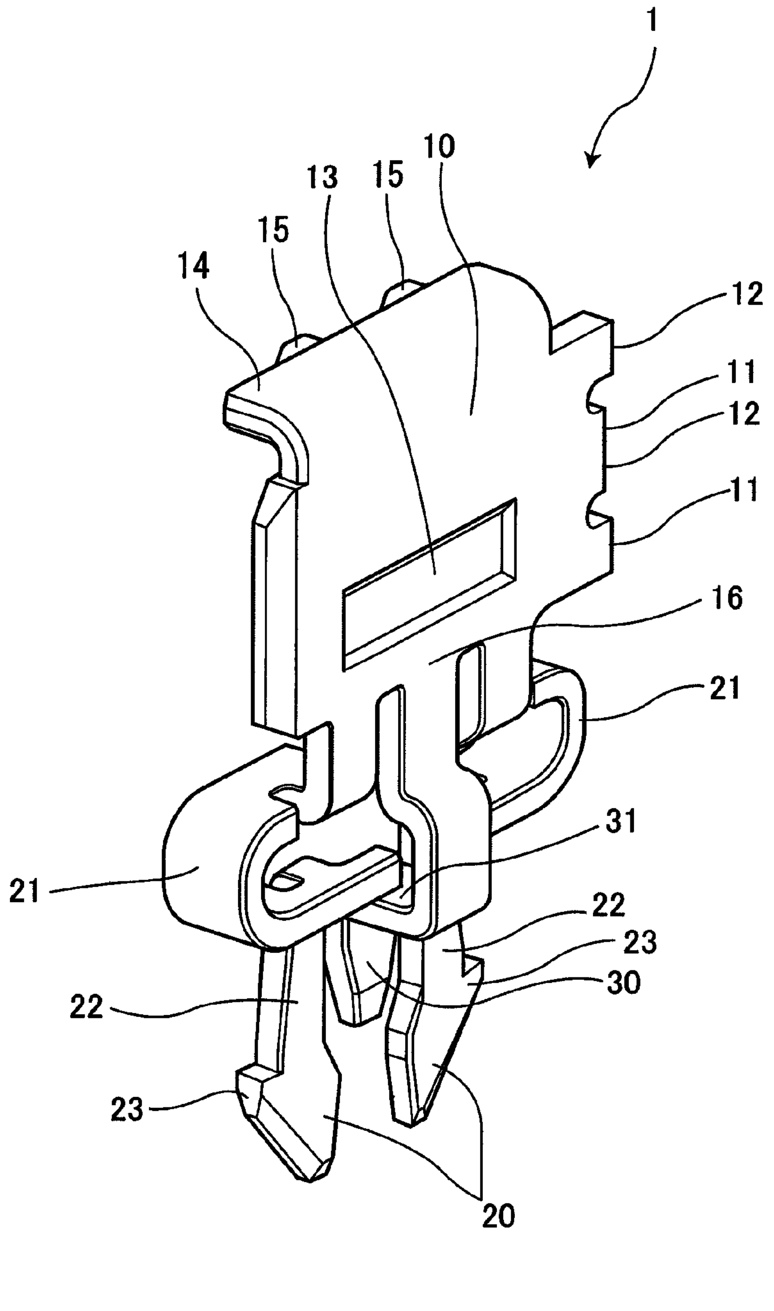
FIG. 2 is a rear perspective view of the holding member according to the invention.
Figure 3:
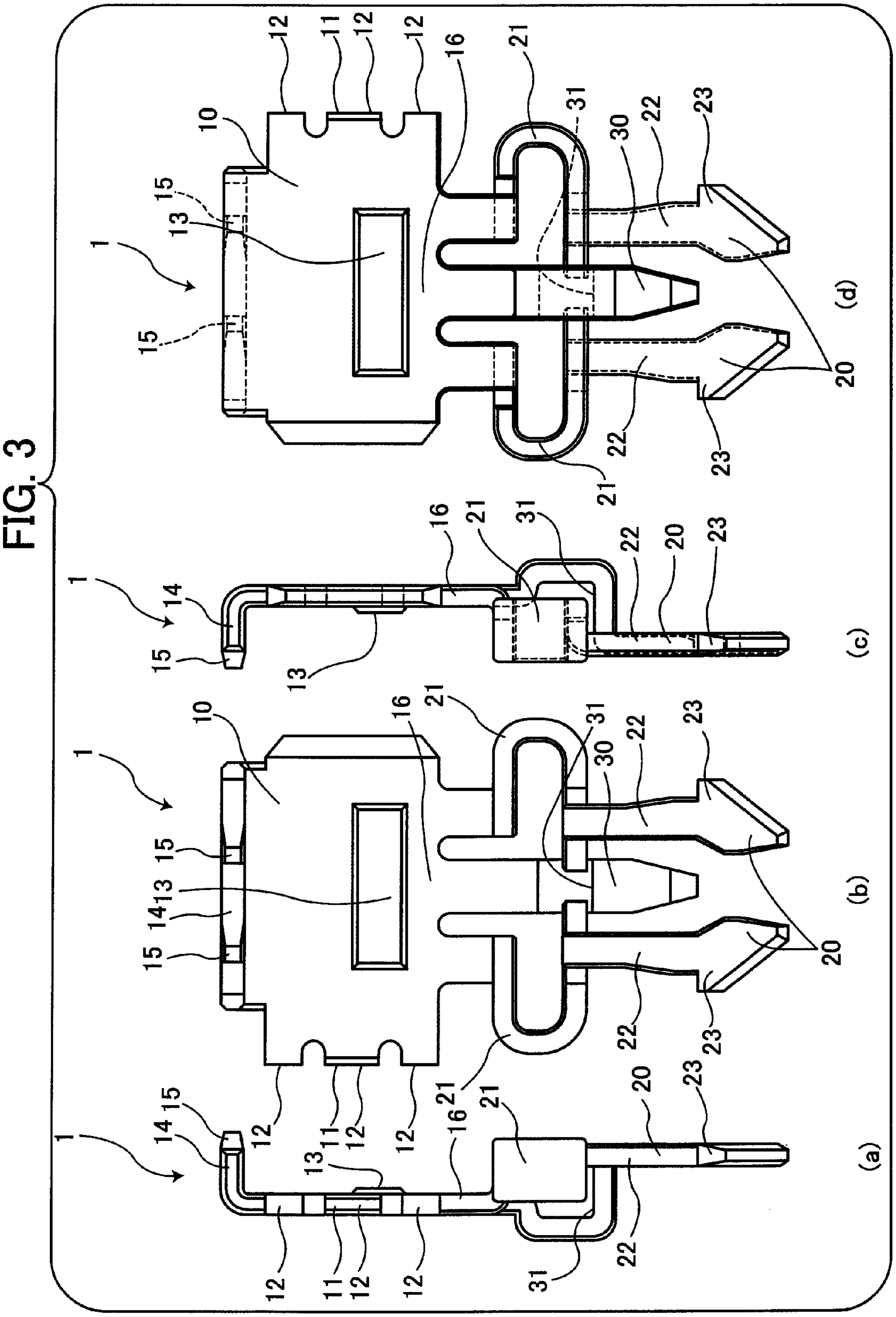
FIG. 3A is a left side view of the holding member according to the invention.
FIG. 3B is a front view of the holding member according to the invention.
FIG. 3C is a right side view of the holding member according to the invention.
FIG. 3D is a rear view of the holding member according to the invention.
Figure 4:
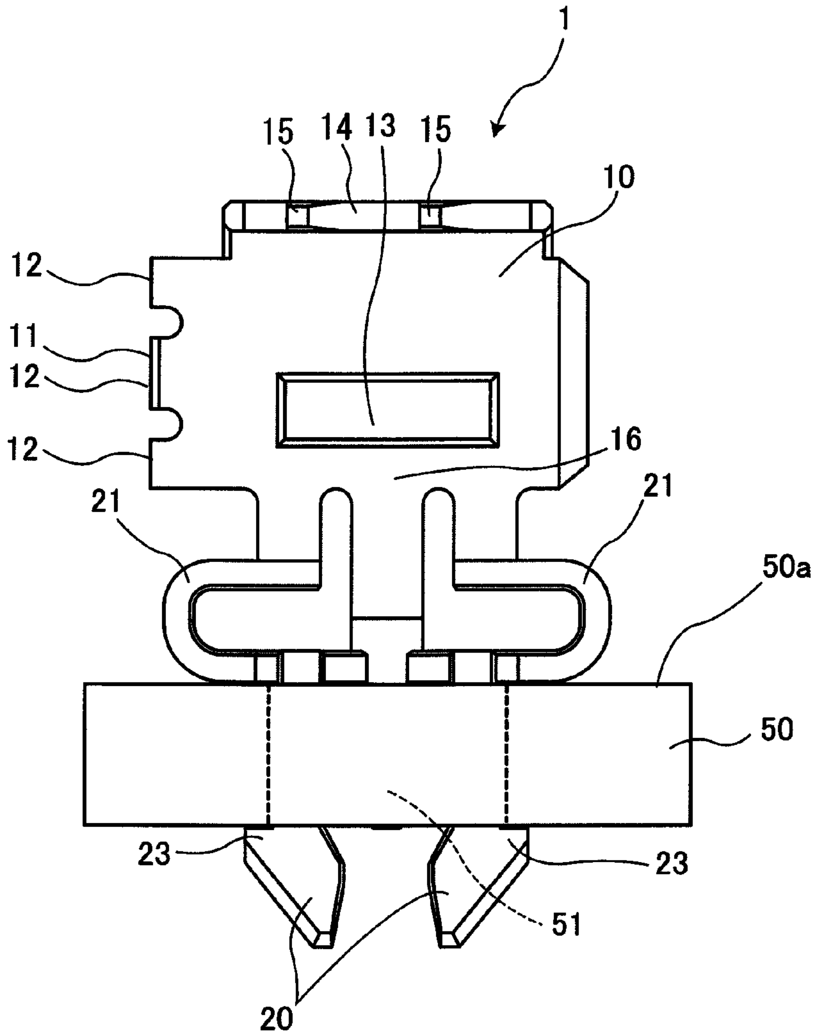
FIG. 4 is a front view of the holding member in FIG. 1 in a state where the holding member is inserted into a through hole of an electric circuit board.

With respect to FIGS. 1-3, a holding member 1 according to the invention is shown, which holds a connector on an electric circuit board by being inserted into a through hole (see FIG. 4) formed in the electric circuit board. A board made of copper compound metal such as brass is subjected to stamping, applying pressure and bending, so that the holding member 1 is formed. Further, the holding member 1 is, for example, plated with tin, thereby having a surface to be wet with molten solder. Incidentally, the holding member 1 is not limited to the tin plating, and may be given, for example, solder plating or gold plating. The holding member 1, according to the invention, includes a base section 10, a pair of first leg sections 20, and a second leg section 30.

The base section 10 has an extension 16 that protrudes downward from one rectangular side. A first set of projections 12 are provided at a side edge 11 of the base section 10. The base section 10 is fixed by being press-fitted into a groove formed on a flank of an insulating housing of the connector. The first set of projections 12 are provided to prevent removal. Further, a second set of projections 15 are positioned on a bent section 14 at an upper end of the base section 10. These second set of projections 15 are provided to prevent removal like the first set of projections 12, and either the first set of projections 12 or the second set of projections 15 may be used depending on the way of attachment to the insulating housing of the connector. Furthermore, a rib 13 for increasing resistance to bending moment is formed on the base section 10 by pressurizing processing. From the extension 16 included in the base section 10 and protruding downward from the one rectangular side, the pair of first leg sections 20 extend in an insertion direction that enables insertion into the through hole. Also, from the extension 16 of the base section 10, the second leg section 30 extends in the same direction as the direction in which the pair of first leg sections 20 extend.

The pair of first leg sections 20 are to be inserted into the through hole formed in the electric circuit board, while making contact with the inner surface of the through hole. The pair of first leg sections 20 are each formed by bending a slim plate extending from the extension 16. Each of the pair of first leg sections 20 includes a spring section 21 extending from the extension 16 and an inserted section 22 extending from the spring section 21 continuously. The inserted section 22 is to be inserted into the through hole. The spring sections 21 are bent midway to extend laterally relative to the insertion direction and outwardly to be separated from each other and then, the spring sections 21 extend inward to be close to each other again after forming outward convex curves respectively. Of the spring section 21, a flat surface of a part extending outward and a flat surface of a part extending inward are formed to face each other. The inserted section 22 is bent at an approximate right angle to the spring section 21 and extends in the insertion direction. The inserted section 22 is approximately perpendicular to both the extension 16 and a mounting surface 50*a* (see FIG. 4).

In addition, each of the pair of first leg sections 20 further includes a hook section 23 that protrudes outward at a tip of the inserted section 22 and is to be caught on an edge of the through hole due to outward bias of the spring section 21 after being inserted into the through hole.

Of the pair of first leg sections 20, the inserted sections 22 extend in directions approximately equal to each other, namely in the insertion direction toward the through hole. Further, the pair of first leg sections 20 serve as springs supported by the base section 10 and are inserted into the through hole in a state in which the pair of first leg sections 20 are elastically displaced.

The second leg section 30 is formed at the approximate midpoint between the pair of first leg sections 20 and extends from the base section 10 in the same direction as the direction in which the pair of first leg sections 20 extend, namely in the insertion direction toward the through hole. The second leg section 30 has a control section 31 that is bent at the approximately right angle at a position closer to the tip of the pair of first leg sections 20 than the spring section 21 and extends up to a position to face the spring sections 21. The control section 31 regulates a stretch of the spring sections 21 in the insertion direction, which occurs when the pair of first leg sections 20 are pulled hard in the insertion direction. Further, the second leg section 30 has a part bent at the approximately right angle and extending further from the control section 31 in the insertion direction toward the through hole, so that a gap into which molten solder is to flow between the second leg section 30 and each of the pair of first leg sections 20. Specifically, the width of this gap, in the shown embodiment, is typically about 0.4 mm With reference to FIG. 4, the holding member 1 is shown, in a state in which the holding member 1 is inserted into a through hole 51 of an electric circuit board 50.

In the electric circuit board 50, the through hole 51 is formed, and a copper plating layer (not illustrated) is formed on an inner surface of the through hole 51 and a part, which is near the through hole 51, of the electric circuit board 50. The thickness of the electric circuit board 50 is typically 1.2 to 1.6 mm, in the embodiment shown.

The holding member 1 is inserted from a side where the mounting surface 50*a* of the electric circuit board 50 is positioned. To be more specific, the pair of first leg sections 20 and the second leg section 30 are inserted into the through hole 51.

The pair of first leg sections 20 of the holding member 1, in the shown embodiment, each have the spring section 21 and thus, the outer surfaces of the pair of first leg sections 20 make soft contact with the inner surface of the through hole 51, during the time of the insertion into the through hole 51. Therefore, according to the holding member 1 of the invention, damage to the inner surface of the through hole 51 is minimized or prevented.

Further, the pair of first leg sections 20 of the holding member 1 in the shown embodiment each have the hook section 23. In the state in which the holding member is merely inserted into the through hole 51 and yet to be soldered, the pair of first leg sections 20 and the second leg section 30 are prevented or limited from coming out of the through hole 51.

Furthermore, the second leg section 30 of the holding member 1, in the shown embodiment, has the control section 31 and thus, a stretch of the spring section 21 in each of the pair of first leg sections 20 in the insertion direction is regulated. Therefore, according to the holding member 1, even if the holding member 1 is pulled hard in the state in which the holding member 1 is merely inserted into the through hole 51 and yet to be soldered, namely in a state in which the hook sections 23 are caught on the edge of the through hole 51, the spring sections 21 are prevented from stretching. This avoids such a problem that soldering is performed in a state in which a gap is formed between an undersurface of the housing of the connector and the surface of the electric circuit board.

According to the invention, the holding member 1 is inserted into the through hole 51, and then is soldered to the electric circuit board 50 together with terminals of the connector in a solder flow process.

Subsequently, a mounting structure in which the holding member 1 is fixed to the electric circuit board 50 by the solder will be described, together with a step in which the soldering is performed in the solder flow process.

Figure 5:
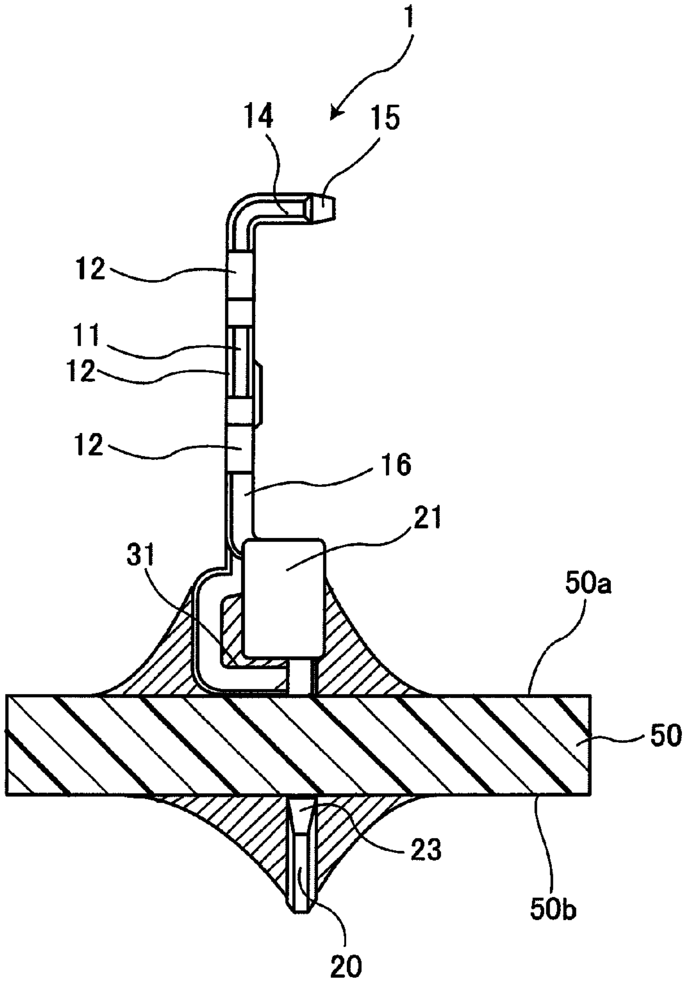
FIG. 5 is a side view of a mounting structure in which the holding member according to the invention is fixed to the electric circuit board by the solder in a solder flow process.
Figure 6:
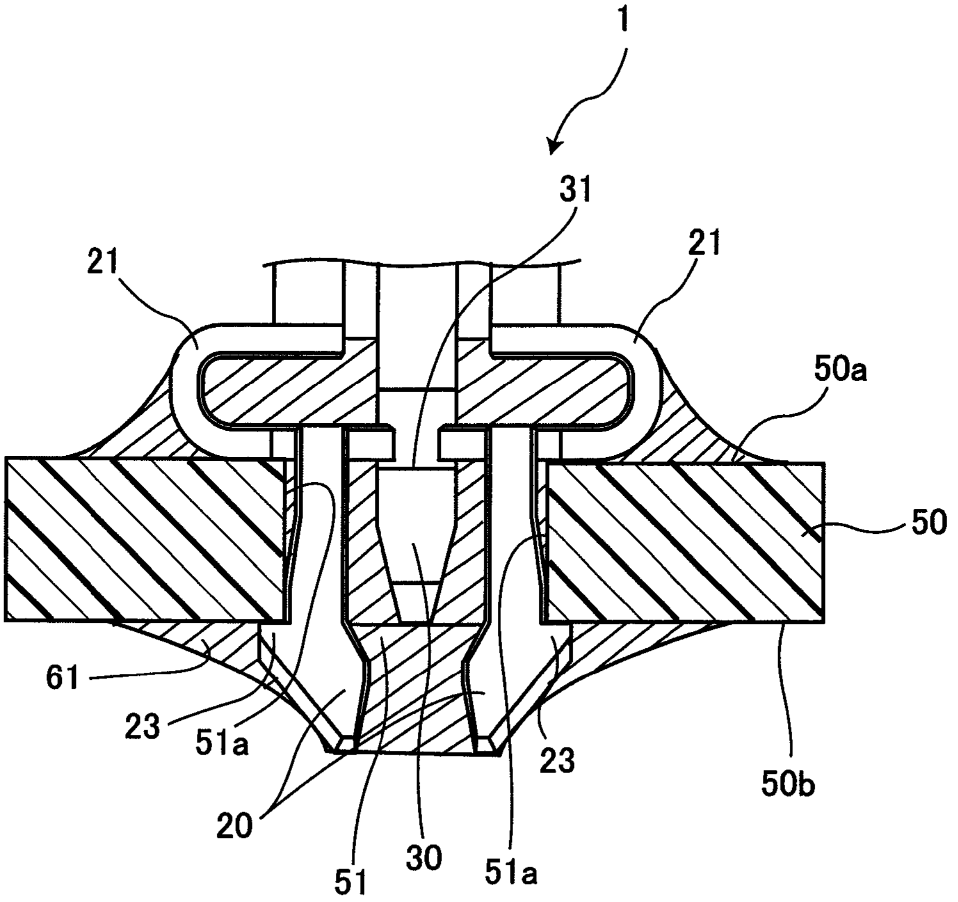
FIG. 6 is a sectional view of the mounting structure in FIG. 5.

Referring to FIGS. 5 and 6, a mounting structure 60 is shown, in which the holding member 1 described above is fixed to the electric circuit board 50 by the solder. The mounting structure 60 in which the holding member 1 is fixed to the electric circuit board 50 by the solder and at the same time depict a state in which the molten solder adheres to the electric circuit board 50 and the holding member 1 in the solder flow process. Here, both the solder in a molten state in the solder flow process and the solder in a solid state are indicated by the same reference number 61 and will be described.

In the solder flow process, in a state in which the holding member 1 is being inserted into the through hole 51, a soldered surface 50*b* of the electric circuit board 50 is dipped into the molten solder 61. Then, both the copper plating layer (not illustrated) and the holding member 1 become wet with the molten solder 61. The copper plating layer is formed on an inner surface 51*a* of the through hole 51 and a part, which is near the through hole 51, of the mounting surface 50*a*. The molten solder 61 streams along the surfaces of the pair of first leg sections 20 and the inner surface 51*a* of the through hole 51, and rises within the through hole 51. The second leg section 30 is formed at the approximate midpoint between the pair of first leg sections 20 and therefore, the molten solder 61 rises along the surface of the second leg section 30 as well. The gap between the second leg section 30 and each of the pair of first leg sections 20 has a width, such that the molten solder 61 may flow into the gap. Therefore, the molten solder 61 is drawn up while streaming in the gap formed between the second leg section 30 and each of the pair of first leg sections 20 due to the capillarity. The molten solder 61 drawn up in the through hole 51 soon rises along the surfaces of the pair of first leg sections 2 and the second leg section 30.

As a result, as shown in FIG. 6, the molten solder 61 completely fills the through hole 51 and is further drawn up to go beyond the mounting surface 50*a* of the electric circuit board 50 from the through hole 51. Afterwards, on the mounting surface 50*a* of the electric circuit board 50, fillet that spans the pair of first leg sections 20 as well as the second leg section 30 and the mounting surface 50*a* of the electric circuit board 50 is formed.

The mounting structure 60 is formed when the molten solder 61 is cooled and solidified after the solder flow process. On the soldered surface 50*b* of the electric circuit board 50, fillet that spans the pair of first leg sections 20 as well as the second leg section 30 and the soldered surface 50*b* is formed by the solder 61 and also, the fillet that spans the pair of first leg sections 20 as well as the second leg section 30 and the mounting surface 50*a* is formed on the mounting surface 50*a*. Incidentally, the mounting structure 60 illustrated in FIG. 5 and FIG. 6 is equivalent to an example of the mounting structure of the present invention.

According to the mounting structure 60, the electric circuit board 50 and the pair of first leg sections 20 as well as the second leg section 30 of the holding member 1 are soldered to each other and thus, the holding member 1 is firmly fixed to the electric circuit board 50. In other words, the connector having the holding member 1 is firmly fixed to the electric circuit board 50 by undergoing a soldering process.

In addition, the solder is a soft metal and thus, if space between the pair of first leg sections 20 is filled with only the solder, the solder easily deforms in response to a removal force. However, according to the mounting structure 60 of the invention, the second leg section 30 is disposed between the pair of first leg sections 20 and thus, a solder layer filling the through hole 51 is made thin and the second leg section 30 receives an external force. Therefore, the solder filling the through hole 51 does not readily deform in response to the removal force.

Subsequently, the connector held on the electric circuit board by the holding member will be described.

Figure 7:
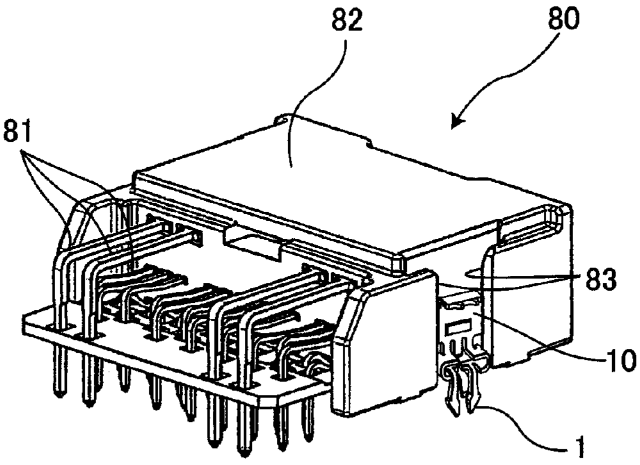
FIG. 7 is a perspective view of a connector having the holding member according to the present invention.
Figure 8:
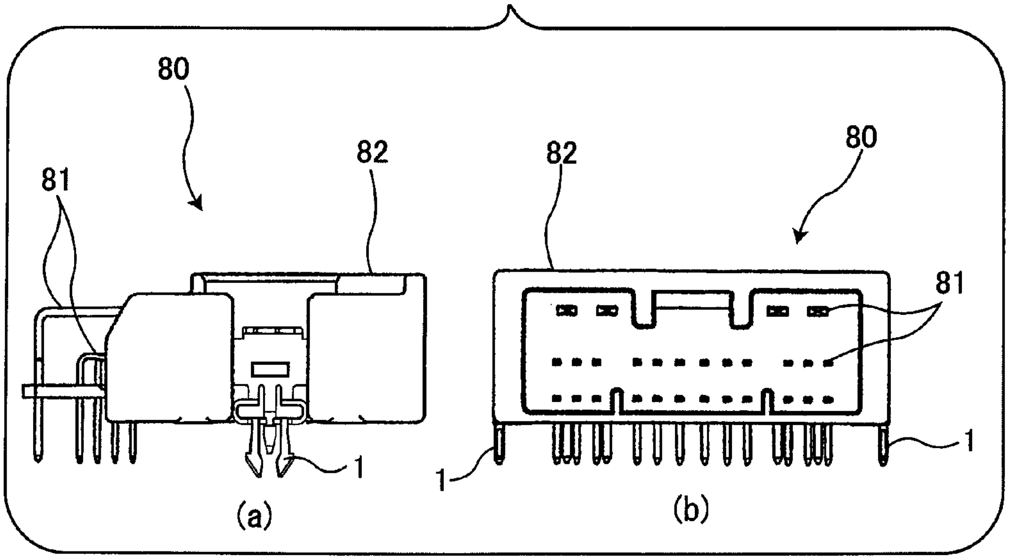
FIG. 8A is a side view of the connector in FIG. 7.
FIG. 8B is a front view of the connector in FIG. 7.
Figure 9:
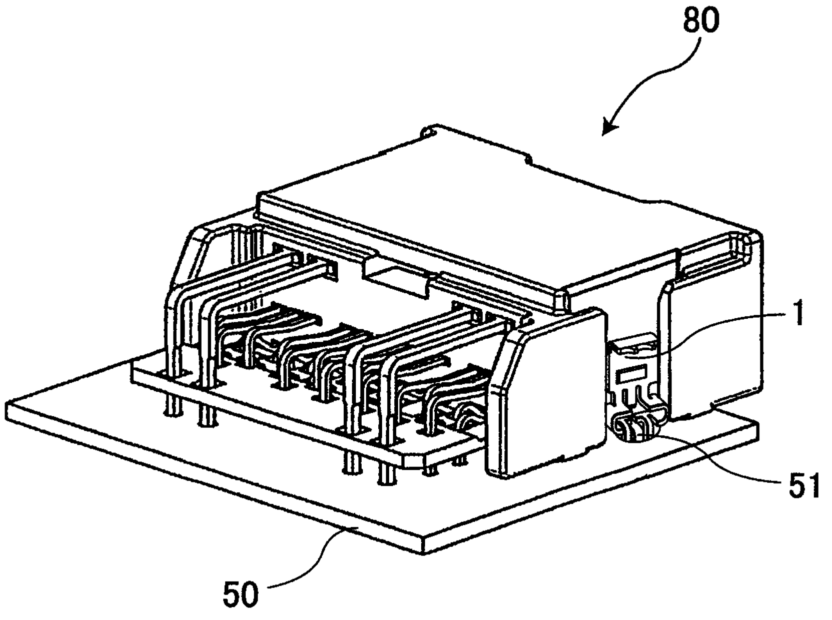
FIG. 9 is a perspective view of the connector illustrated in FIG. 7 and FIG. 8 being held on an electric circuit board.

FIGS. 7 through 9 show a connector 80, which is an embodiment of the electronic part according to the invention. The connector 80 is mounted on the electric circuit board built in an electronic device, and electrically connects a circuit on the electric circuit board to another circuit by being mated with another connector (not illustrated) paired with the connector 80.

The connector 80 includes the holding member 1 described above, contacts 81 to be connected with the circuit on the electric circuit board and a housing 82 that secures the holding member 1 and the contacts 81. When the base section 10 of the holding member 1 is press-fitted into a groove 83 formed in the connector 80, the holding member 1 is attached to the connector 80.

When the holding member 1 is inserted into the through hole 51, the connector 80 is held on the electric circuit board 50. After the electric circuit board 50 in this state passes the solder flow process, the holding member 1 is soldered to the electric circuit board 50.

According to the connector 80 of the shown embodiment, in the state in which the holding member 1 is merely inserted into the through hole 51 and yet to be soldered, the hook sections 23 are caught on the edge of the through hole 51 so that the connector 80 is held on the electric circuit board 50 not to fall off the electric circuit board 50, without damaging the inner surface of the through hole 51. In other words, the pair of first leg sections 20 and the second leg section 30 are prevented from coming out of the through hole 51.

Next, another embodiment of the holding member according to the invention will be described, with reference to FIGS. 10 through 12.

Incidentally, the embodiment described below is similar to the first embodiment except that the second leg section 30 of the holding member 1 in the first embodiment is replaced by a second leg section 40 whose shape is different from that of the second leg section 30.

In the following description, the same elements as those of the first embodiment will be given the same reference characters as those of the first embodiment and will not be described and, only a feature different from the first embodiment will be described.

The second leg section 40 of the holding member 2 is formed at an approximate midpoint between the pair of first leg sections 20 and extends from the base section 10 in the same direction as the direction in which the pair of first leg sections 20 extend, namely in the insertion direction toward the through hole. The second leg section 40 has, at a position closer to the tip of the pair of first leg sections 20 than the spring sections 21, control sections 41 that extend laterally relative to the insertion direction and outwardly to be separated from each other and extend up to positions to face the spring sections 21. The control sections 41 regulate a stretch of the spring sections 21 in the insertion direction, which occurs when the pair of first leg sections 20 are pulled hard in the insertion direction.

Figure 10:
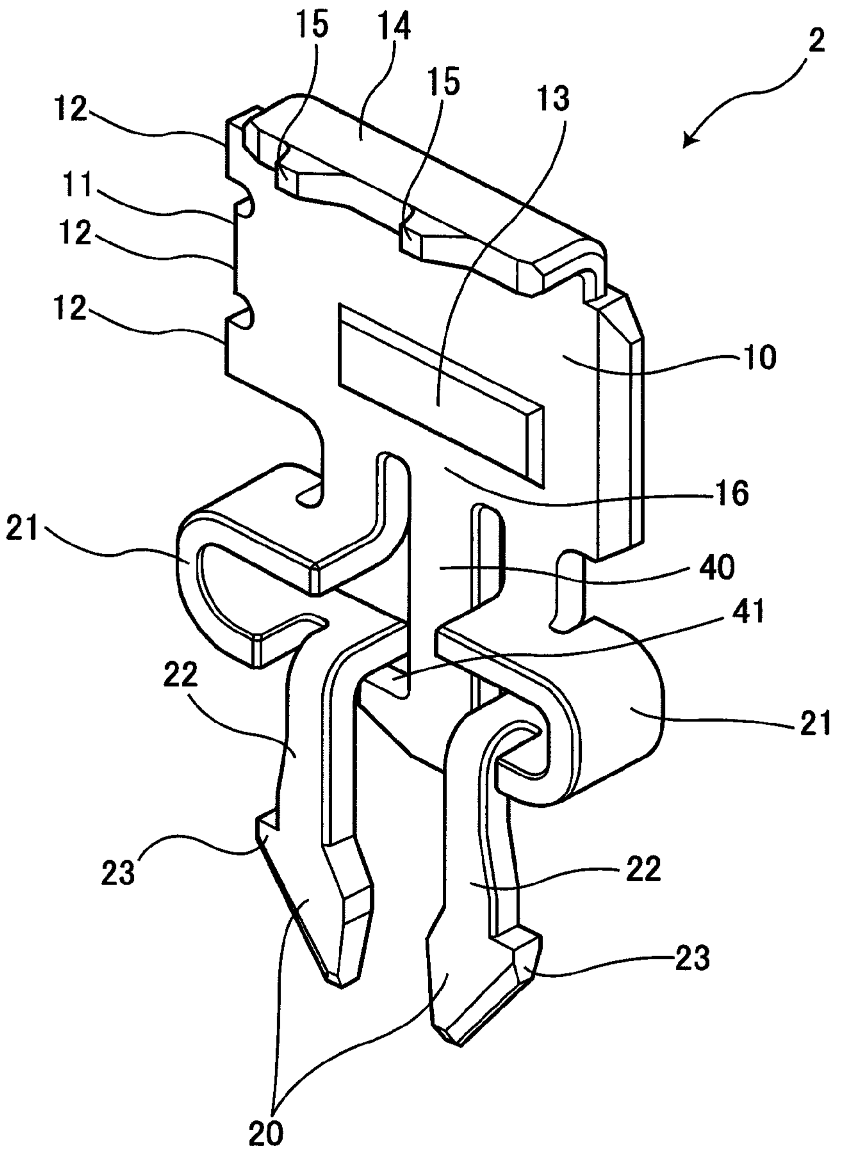
FIG. 10 is a front perspective view of another embodiment of a holding member according to the invention.
Figure 11:
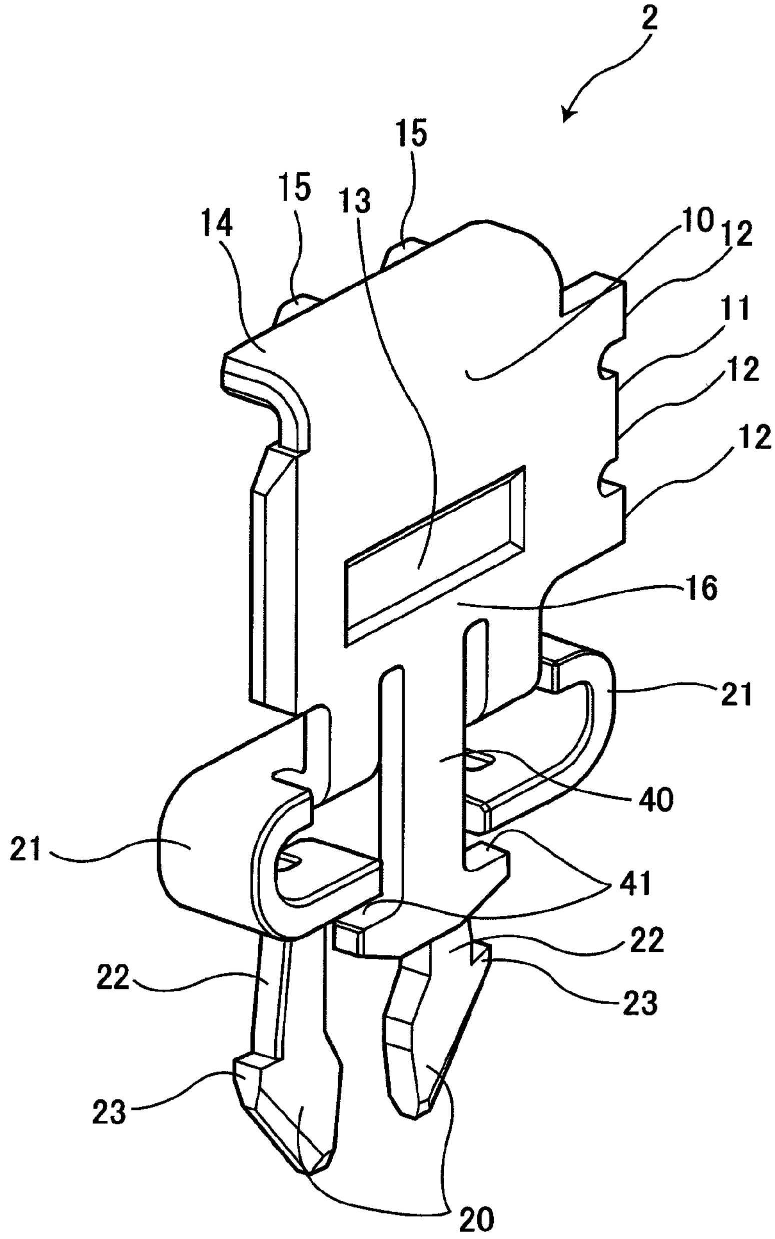
FIG. 11 is a rear perspective view of another embodiment of a holding member according to the invention.
Figure 12:
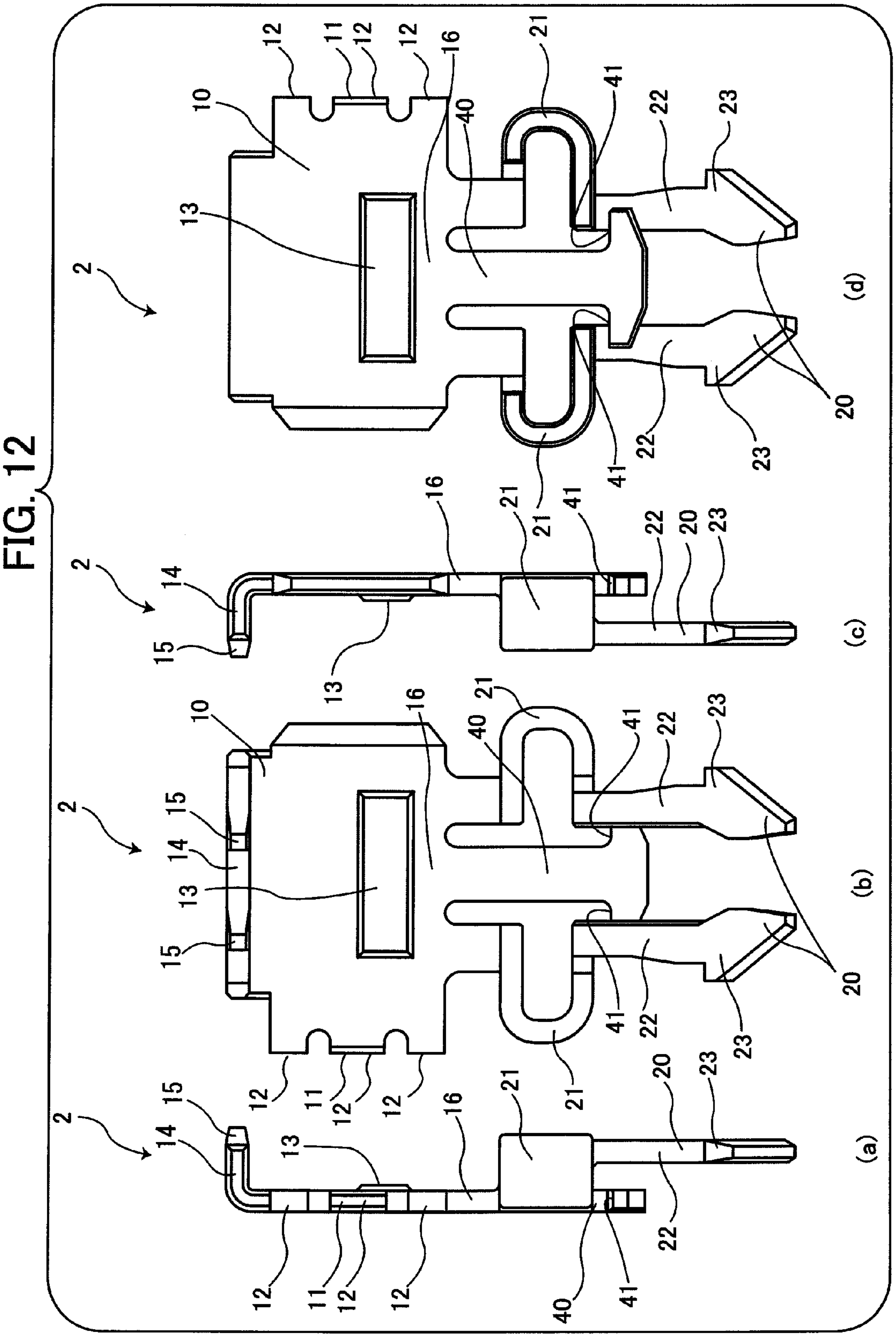
FIG. 12A is a left side view, a front view, a right side view and a rear view of the holding member shown in FIGS. 10 and 11.
FIG. 12B is a front view of the holding member shown in FIGS. 10 and 11.
FIG. 12C is a right side view of the holding member shown in FIGS. 10 and 11.
FIG. 12D is a rear view of the holding member shown in FIGS. 10 and 11.

Like the holding member 1 of the embodiment described in FIGS. 1 through 9, the holding member 2 of the embodiment shown in FIGS. 10 through 12, which includes the above-described second leg section 40, also prevents damage to the inner surface of the through hole. Furthermore, the holding member 2 prevents the leg sections in the state of being merely inserted into the through hole and yet to be soldered from being coming out of the through hole. Further, in the state of being merely inserted into the through hole and yet to be soldered, namely in the state in which the hook sections 23 are caught on the edge of the through hole 51, even if the holding member 2 is pulled hard, a stretch of the spring sections 21 is prevented by the control sections 41. This avoids such a problem that soldering is performed in a state in which a gap is formed between the undersurface of the housing of the connector and the surface of the electric circuit board.

Incidentally, in the above embodiment, the connector 80 has been described as an example of the electronic part according to the present invention, but the present invention is not limited to this example and is applied to other electronic part held on an electric circuit board by a holding member.

Further, as to the connector 80 of the above embodiment, there has been described the example in which the holding member 1 is attached to the connector 80 and then soldered in the solder flow process. However, the present invention is not limited to this example. For example, as illustrated in FIG. 6, the holding member 1 may be fixed to the connector 80 after the holding member 1 is soldered to the electric circuit board 50.

Furthermore, in the above embodiment, there has been described the example in which the soldering is performed in the solder flow process, but the present invention is not limited to this example. For example, the soldering can be performed in a solder reflow process by filling the through hole with solder paste beforehand or in a soldering process using a soldering iron (so-called hand soldering).

Still further, in the above embodiment, the holding member 1 has been described as being made of brass and plated with tin, but the present invention is not limited to this example. The holding member may be anything as long as the holding member is made of metal and has a surface that becomes wet with molten solder. For example, when the holding member is made of copper compound metal such as the brass like the holding member of the above embodiment, the tin plating can be omitted.

According to the invention, even if an external force is laterally applied to the holding member in the state of being merely inserted into the through hole 51 and yet to be soldered, breakage or abnormal deformation of the spring sections 21 is prevented by the second leg section 30. Further, molten solder readily rises within the through hole 51 along the second leg section 30 in the solder flow process.

According to the invention, in the solder flow process, the molten solder readily rises within the through hole 51 by filling the gap formed between the second leg section 30 and each of the first leg sections. Therefore, the attachment strength after the soldering is higher than that of a conventional holding member.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. A holding member comprising: a base section that has a plate-like shape; a pair of first leg sections having respective spring sections and hook sections; and a second leg section having a first section extending from the base section between the pair of leg sections and a control section extending out from the first section and engaging with the respective spring sections such that the second leg section restricts deformation of the spring section away from the base section.

2. The holding member according to claim 1, wherein the respective spring sections extend from the base section in an insertion direction, the spring sections bent approximately midway to extend laterally relative to the insertion direction and outwardly to be separated from each other and then extend inward to be close to each other again after forming outward convex curves respectively with the control section positioned there under.

3. The holding member according to claim 2, wherein the respective hook sections which extend from the respective spring sections in the insertion direction, protrude outward at tips and are caught on an edge of a through hole due to outward motion of the spring sections after being inserted into the through hole.

4. The holding member according to claim 3, wherein the control section extends from the base section up to a position to face the spring sections on a side closer to a tip than the spring sections, and regulates a stretch of the spring sections.

5. The holding member according to claim 4, wherein in each of the spring sections, a flat surface of a part extending outward and a flat surface of a part extending inward are formed to face each other.

6. The holding member according to claim 1, further comprising a gap formed between the second leg section and each of the pair of first leg sections.

7. The holding member according to claim 4, wherein the second leg section is formed at an approximate midpoint between the pair of first leg sections.

8. The holding member according to claim 7, further comprising a gap formed between the second leg section and each of the pair of first leg sections.

9. The holding member according to claim 1, wherein the holding member is made of metal and has a surface to be wet with molten solder.

10. The holding member according to claim 4, wherein the holding member is made of metal and has a surface to be wet with molten solder.

11. The holding member according to claim 8, wherein the holding member is made of metal and has a surface to be wet with molten solder.

12. A mounting structure comprising: an electric circuit board having a through hole; a holding member inserted into the through hole and holding an electronic part on the electric circuit board, the holding member having: a base section that has a plate-like shape; a pair of first leg sections having respective spring sections and hook sections; a second leg section having a first section extending from the base section between the pair of leg sections and a control section extending out from the first section and engaging with the respective spring sections such that the second leg section restricts deformation of the spring section away from the base section; and solder that fixes the holding member to the electric circuit board by filling the through hole into which the first leg sections are inserted.

13. The mounting structure according to claim 12, wherein the respective spring sections extend from the base section in an insertion direction, the spring sections bent approximately midway to extend laterally relative to the insertion direction and outwardly to be separated from each other and then extend inward to be close to each other again after forming outward convex curves respectively with the control section positioned there under.

14. The mounting structure according to claim 13, wherein the respective hook sections which extend from the respective spring sections in the insertion direction, protrude outward at tips and are caught on an edge of the through hole due to outward motion of the spring sections after being inserted into the through hole.

15. The mounting structure according to claim 14, wherein the control section extends from the base section up to a position to face the spring sections on a side closer to a tip than the spring sections, and regulates a stretch of the spring sections.

16. The mounting structure according to claim 15, wherein in each of the spring sections, a flat surface of a part extending outward and a flat surface of a part extending inward are formed to face each other.

17. The mounting structure according to claim 12, further comprising a gap formed between the second leg section and each of the pair of first leg sections.

18. The mounting structure according to claim 15, wherein the second leg section is formed at an approximate midpoint between the pair of first leg sections.

19. The mounting structure according to claim 18, further comprising a gap formed between the second leg section and each of the pair of first leg sections.

20. The mounting structure according to claim 12, wherein the holding member is made of metal and has a surface to be wet with molten solder.

21. The mounting structure according to claim 15, wherein the holding member is made of metal and has a surface to be wet with molten solder.

22. A holding member comprising: a base section that has a plate-like shape; a pair of first leg sections having respective spring sections and hook sections; and a second leg section having a first section extending from the base section between the pair of leg sections and a control section extending out from the first section and engaging with the spring sections, and regulating a stretch of the spring sections in an insertion direction.

23. The holding member according to claim 22, wherein the respective spring sections extend from the base section in an insertion direction, the spring sections bent approximately midway to extend laterally relative to the insertion direction and outwardly to be separated from each other and then extend inward to be close to each other again after forming outward convex curves respectively.

24. The holding member according to claim 23, wherein the respective hook sections which extend from the respective spring sections in the insertion direction, protrude outward at tips and are caught on an edge of a through hole due to outward motion of the spring sections after being inserted into the through hole.

25. The holding member according to claim 22, wherein in each of the spring sections comprises a flat surface of a part extending outward and a flat surface of a part extending inward are formed to face each other.

26. The holding member according to claim 22, wherein the second leg section is formed at an approximate midpoint between the pair of first leg sections.

27. The holding member according to claim 22, further comprising a gap formed between the second leg section and each of the pair of first leg sections.

28. The holding member according to claim 26, further comprising a gap formed between the second leg section and each of the pair of first leg sections.

29. The holding member according to claim 22, wherein the holding member is made of metal and has a surface to be wet with molten solder.

30. The holding member according to claim 28, wherein the holding member is made of metal and has a surface to be wet with molten solder.

31. A mounting structure comprising: an electric circuit board having a through hole; a holding member inserted into the through hole and holding an electronic part on the electric circuit board, the holding member having: a base section that has a plate-like shape; a pair of first leg sections having respective spring sections and hook sections; a second leg section having a first section extending from the base section between the pair of leg sections and a control section extending out from the first section and engaging with the spring sections to regulate a stretch of the spring sections away from the base section; and solder that fixes the holding member to the electric circuit board by filling the through hole into which the first leg sections are inserted.

32. The mounting member according to claim 31, wherein the respective spring sections extend from the base section in an insertion direction, the spring sections bent approximately midway to extend laterally relative to the insertion direction and outwardly to be separated from each other and then extend inward to be close to each other again after forming outward convex curves respectively.

33. The mounting member according to claim 32, wherein the respective hook sections which extend from the respective spring sections in the insertion direction, protrude outward at tips and are caught on an edge of the through hole due to outward motion of the spring sections after being inserted into the through hole.

34. The mounting member according to claim 31, wherein in each of the spring sections comprises a flat surface of a part extending outward and a flat surface of a part extending inward are formed to face each other.

35. The mounting member according to claim 31, wherein the second leg section is formed at an approximate midpoint between the pair of first leg sections.

36. The mounting member according to claim 31, further comprising a gap formed between the second leg section and each of the pair of first leg sections.

37. The mounting member according to claim 35, further comprising a gap formed between the second leg section and each of the pair of first leg sections.

38. The mounting member according to claim 31, wherein the holding member is made of metal and has a surface to be wet with molten solder.

39. The mounting member according to claim 31, wherein the holding member is made of metal and has a surface to be wet with molten solder.

* * * * *